United States Patent [19]

Koerner et al.

[11] 3,938,070
[45] Feb. 10, 1976

[54] TRIMMING POTENTIOMETER IN T OR PI NETWORK CONNECTION WITH PARALLEL RESISTANCE PATHS

[75] Inventors: Georg Koerner, Hohenkirchen; Tibor Hargita, Munich, both of Germany

[73] Assignee: Wilhelm Ruf KG, Hohenkirchen, Germany

[22] Filed: July 30, 1974

[21] Appl. No.: 493,079

[30] Foreign Application Priority Data

Aug. 25, 1973  Germany...................... 7331048[U]

[52] U.S. Cl. .................... 338/60; 323/78; 323/96; 333/81 R; 338/61; 338/126; 338/180; 338/202
[51] Int. Cl.² ..................... H03H 7/26; H01C 10/16; H01C 10/40, 1/12
[58] Field of Search ........... 338/60, 61, 92, 97, 118, 338/120, 123, 125, 126, 128, 130, 133, 176, 180, 183, 194, 202, 322, 327, 328, 334; 323/78, 96; 333/75, 81 R, 70 CR

[56] References Cited
UNITED STATES PATENTS

| | | | |
|---|---|---|---|
| 2,131,101 | 9/1938 | Ferris | 333/81 R |
| 2,831,094 | 4/1958 | Bourns et al. | 338/125 |
| 3,371,305 | 2/1968 | DeLong et al. | 338/202 |
| 3,576,513 | 4/1971 | Mathison et al. | 338/180 |
| 3,597,719 | 8/1971 | Martin et al. | 338/180 |
| 3,639,879 | 2/1972 | Rooijen | 338/180 |
| 3,693,062 | 9/1972 | VonVick | 338/92 |
| 3,735,326 | 5/1973 | Gooding et al. | 338/180 |

FOREIGN PATENTS OR APPLICATIONS 1,540,339  11/1972  Germany .......................... 338/180

OTHER PUBLICATIONS

German Utility Model (Gebrauchsmuster) No. 1,957,345, 3-1967.

*Primary Examiner*—Laramie E. Askin
*Attorney, Agent, or Firm*—Max Fogiel

[57] ABSTRACT

A trimming potentiometer in which three parallel resistance paths are located in a plane on an insulating plate. Wiper contacts are displaceable in the same direction on the resistance paths, and are attached to a common carrier which is longitudinally displaceable by a threaded spindle. Inductance loops are arranged between the resistance paths and the respective terminals for the paths, for the purpose of matching the trimming potentiometer to its inductance and capacitive input and output values.

9 Claims, 4 Drawing Figures

U.S. Patent   Feb. 10, 1976   3,938,070
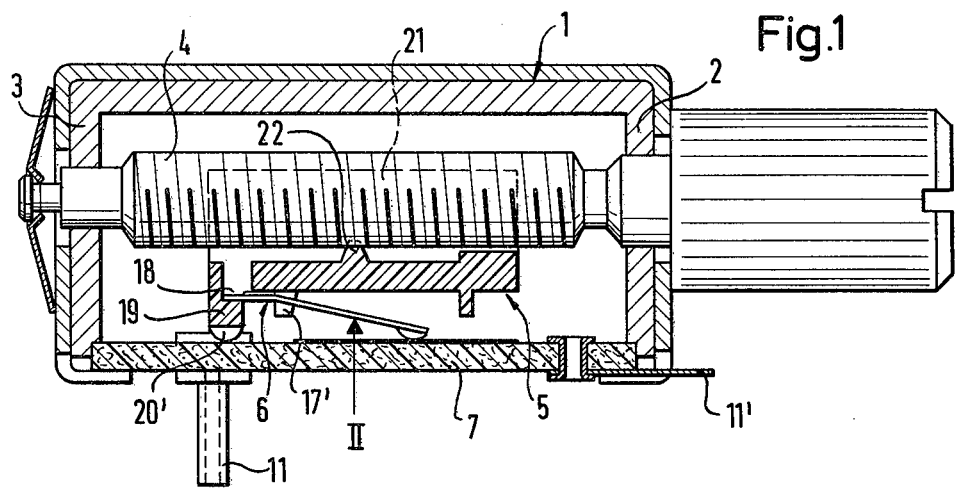
Fig.1
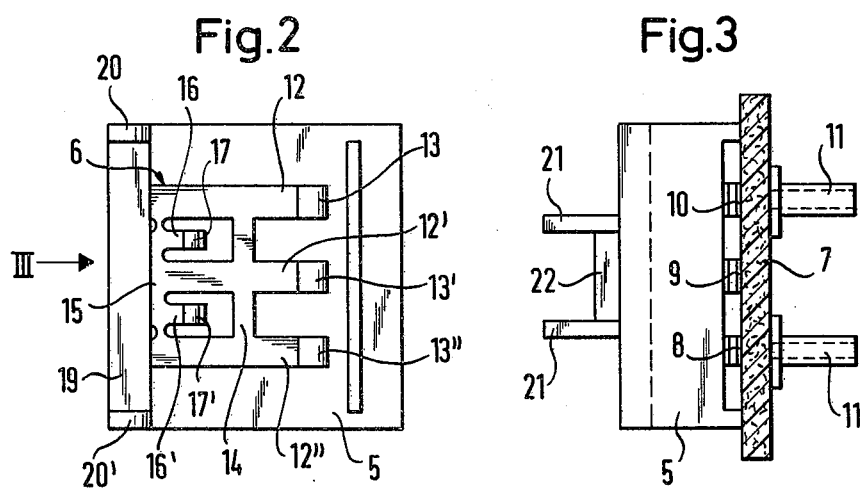
Fig.2
Fig.3
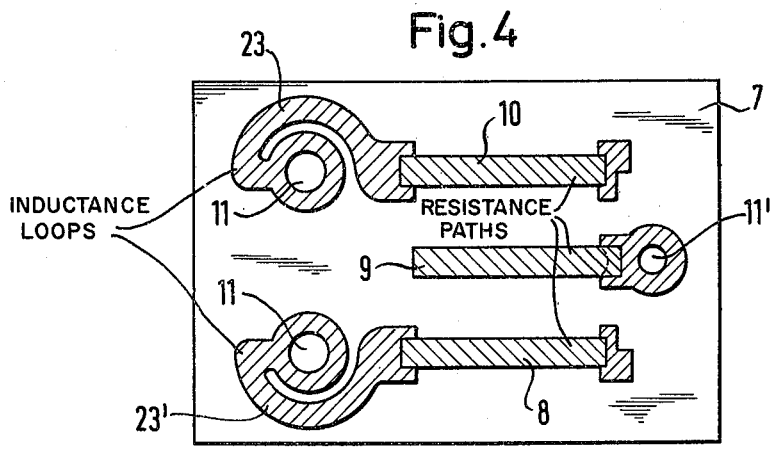
Fig.4

3,938,070

TRIMMING POTENTIOMETER IN T OR PI NETWORK CONNECTION WITH PARALLEL RESISTANCE PATHS

BACKGROUND OF THE INVENTION

The present invention concerns a trimming potentiometer in T- or Pi-network connection with three parallel resistance paths located in a plane on an insulating plate. Along these resistance paths, wiper contacts fastened to a common carrier and moving in the same direction can be displaced. The carrier is in operative connection, through lengthwise displacement, with a screw spindle.

Trimming potentiometers of this species are already known from the German patent Dt-GM 1,957,345 as adjustable attenuator pads. They contain wiper contacts which are located in a plane normal to the longitudinal direction of the resistance paths. These attenuator pads are in particular for common antenna installations, and serve for adjusting to a desired attenuation between two high-frequency connections.

In a trimming potentiometer design known from German patent DT-OS 1,926,199, the carrier for the wiper contacts is provided with a trough-shaped cross section and can be displaced by sliding action along the screw spindle.

German patent DT-PS 1,540,339 provides for the use of a sleeve for the wiper contacts. This sleeve is slipped over the screw spindle and has a reinforcing portion with a depth approximately equal to the depth of thread of the screw spindle, located at an angle equivalent to the pitch angle of the screw spindle.

Based on this state of the art, it is an object of the present invention to further improve a trimming potentiometer of the character described above.

Another object of the present invention is to provide a trimming potentiometer which is simple in design and may be easily fabricated.

Another object of the present invention is to provide a trimming potentiometer with substantially long operating life.

SUMMARY OF THE INVENTION

The objects of the present invention are achieved by providing an inductance loop between the resistance paths and the associated terminal lugs for the electrical, and particularly frequency-wise, matching of the trimming potentiometer to its fixed inductive and capacitive input and output values.

In a further embodiment, the wiper contacts may be connected and maintain contact near their contact surfaces by a common crossbar and may have a second end crossbar. This crossbar has leaf springs located between the wiper contacts in the direction towards the contact surfaces. The springs rest against projections or lugs of the carrier of the wiper contacts. The rear-end of this second crossbar fits into recesses in a bridge running transversely across the carrier. Because of the first crossbar, very short electrical paths between the wiper contacts are attained, and an undesirable inductance is avoided; the second crossbar only serves to fasten the wiper contacts to the common carrier. The method of fastening permits a quick and simple insertion of the wiper contacts onto the carrier and replacement at any time without causing damage to the carrier or the wiper contacts. Furthermore, the connection is sufficiently safe and self-acting disconnection or break of the wiper contacts is eliminated.

To accomplish the above purpose of improving the state of the art of trimming potentiometers with respect to design and functional operation, the present invention provides for a trimming potentiometer based on the following combination of individual partially known characteristics:

a. the trimming potentiometer has a T- pr Pi-network.

b. the trimming potentiometer has three parallel paths located in a plane on an insulator. Wiper contacts fastened to a common carrier and moving in the same direction can be displaced along these resistance paths;

c. for the electrical, particularly frequencywise, matching of the trimming potentiometer to its fixed inductive and capacitive input and output values, inductance loops are provided between the resistance paths and the terminal lugs;

d. the carrier for the wiper contacts has a trough-shaped cross section with a crossbar whose height is approximately equal to the depth of thread of the screw spindle with which the carrier is in continuous contact. It is located at an angle equal to the pitch angle of the screw spindle.

e. the carrier for the wiper contacts is forced under spring pressure against the screw spindle by the wiper contacts with their trough-shaped cross-section, sliding along the resistance paths;

f. wiper contacts are connected to one another mechanically and electrically near their contact surfaces by a common first crossbar;

g. the wiper contacts have a second common end crossbar. This crossbar has leaf springs located between the wiper contacts in the direction towards their contact surfaces. These springs rest against projections or lugs on the carrier. The rear end of the second crossbar fits into recesses in a bridge running transversely across the carrier.

The bridge of the carrier may be provided with lugs located at both ends. These lugs slide under spring pressure by the wiper contacts on the insulator plate adjacent to the resistance paths. This design prevents tilting and twisting of the carrier during its longitudinal displacement caused by the screw spindle.

According to the present invention, the terminal lugs of the resistance paths may be in the form of tubular rivets inserted into the insulator plate.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIG. 1 is a longitudinal sectional view through the trimming potentiometer in accordance with the present invention;

FIG. 2 is a plan view of the wiper contacts with carrier in accordance with the direction of arrow II in FIG. 1;

FIG. 3 is a side view of the carrier with wiper contacts and supporting insulator plate with resistance paths in accordance with the direction of arrow III in FIG. 2;

FIG. 4 is a plan view of the resistance paths located on the insulator plate, in accordance with the present invention.

DESCRIPTION OF THE PREFERRED EMBODIMENTS

Referring to the drawing, the trimming potentiometer consists essentially of a housing 1, screw spindle 4 located rotatably but not displacably axially in drill holes of front sides 2 and 3 of housing 1, carrier 5 actuated by screw spindle 4 for its wiper contacts 6 and insulator plate 7 located at the bottom of housing 1 with the three resistance paths 8, 9, 10 which are electrically connected with soldered connections 11, 11'. The three resistance paths 8, 9, 10 are placed parallel in a plane adjacent to each other on the insulator plate, and are rectinlinear parallel to the longitudinal axis of screw spindle 4. Resistance paths 8 and 10 are connected in the same direction with respect to their resistance values, and resistance path 9 is connected in the opposite direction, corresponding to a T-network. Along the three resistance paths 8, 9, 10, wiper contacts 12, 12', 12" are connected mechanically and electrically by a first crossbar 14. By means of this crossbar 14, contact surfaces 13, 13' and 13" are connected to one another through short paths in order to avoid undesirable inductance. With its second crossbar 15, the wiper contacts are fastened to carrier 5. This is accomplished by providing crossbar 15 with leaf springs 16, 16' pointing to contact surfaces 13, 13', 13" between wiper contacts 12, 12', 12". These leaf springs rest on lugs 17, 17' which are an integral part of carrier 5. Furthermore, the back end of crossbar 15 is placed in recesses 18 of a bridge 19 running transversely across carrier 5. This type of fastening permits the immediate installation and removal of the wiper contacts on the carrier 5, without causing damage to the individual parts. Carrier 5 made of insulating synthetic material slides with two lugs 20, 20' located at the ends of bridge 19 on the insulator plate 7 next to resistance paths 8, 9, 10. Lugs 20, 20' prevent tilting or twisting of carrier 5 during its longitudinal displacement. On the side facing wiper contacts 12, 12', 12", carrier 5 has a trough-like profile formed by two bars 21. This profile (cross section) extends at least partially around screw spindle 4 and thus assists in the axial rectilinear movement of the carrier 5 parallel to the resistance paths 8, 9, 10. Lengthwise displacement of the carrier is accomplished by crossbar 22 located at the bottom in the trough-shaped cross section. This crossbar is in constant contact with the threads of screw spindle 4. To accomplish this, cross-bar 22 is located in the trough-shaped cross section of carrier 5 at an angle equal to the pitch angle of screw spindle 4. The height of crossbar 22 is equal to or larger than the depth of thread of the screw spindle, to prevent carrier 5 from touching screw spindle 4. If, during the continuous rotation of screw spindle 4 in one direction of rotation, carrier 5 together with the wiper contacts hits one of the inside faces of housing 1 limiting the displacement, the crossbar 22 jumps from the one thread to the next one; this is possible because of the springy support of carrier 5 by wiper contacts 12, 12', 12". Hence, damage to the various parts in operative connection is prevented. The click arising when crossbar 22 jumps the screw threads of screw spindle 4, calls the end position to the attention of the operator.

The soldering connections 11 and 11' connected to resistance paths 8, 9, 10 are tubular rivets and therefore can easily be fastened to the insulator plate.

In order to accomplish electrical matching of the trimming potentiometer, particularly frequency-wise, to its fixed inductive and capacitive input and output values, inductance loops 23, 23', are located between resistance paths 8, 9, 10 and the associated terminal lugs 11, 11'. The size and shape of these inductance loops depends on the overall design of the trimming potentiometer and must ordinarily be determined by tests and experiments from case to case. It was found, however, that the existence of such inductance loops results in a definite improvement of the functional operation and in an exact and constant adjustment of the resistance values of the trimming potentiometer.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A trimming potentiometer comprising, in combination, an insulating plate; three parallel resistance paths in a plane on said insulating plate; terminals connected to said resistance paths; wiper contacts displaceable in the same direction on said resistance paths; carrier means attached to said wiper contacts for mounting said contacts; a threaded spindle connected to said carrier means for displacing said carrier means longitudinally; and inductance loop means between said resistance paths and said terminals for matching electrically the trimming potentiometer to its inductive and capacitive input and output values.

2. The trimming potentiometer as defined in claim 1 including first crossbar means connecting said wiper contacts together near their contact surfaces; second crossbar means having leaf springs; lugs on said carrier means, said leaf springs being located between said wiper contacts in the direction toward their contact surfaces, said leaf springs resting against said lugs of said carrier means; and bridge means transversely across said carrier means and having recesses receiving the rear end of said second crossbar means.

3. A trimming potentiometer as defined in claim 2 wherein said carrier means has a trough-shaped cross section with an auxiliary crossbar arranged at an angle corresponding to the pitch angle of said spindle, said auxiliary crossbar having a height corresponding substantially to the depth of thread of said threaded spindle, said carrier means being forced under spring pressure against said screw spindle by said wiper contacts, said wiper contacts being arranged on the rear side of said trough-shaped carrier means.

4. The trimming potentiometer as defined in claim 2, wherein said bridge means has lugs at both ends for sliding on said insulating plate adjacent said resistance paths, said lugs sliding under pressure by said wiper contacts.

5. The trimming potentiometer as defined in claim 2 wherein said wiper contacts are connected to one another mechanically and electrically near their contact surfaces by said first crossbar.

6. The trimming potentiometer as defined in claim 1 wherein said terminals of said resistance paths comprise tubular rivets inserted in said insulating plate.

7. The trimming potentiometer as defined in claim 1 wherein said trimming potentiometer is connected in a T-network configuration.

8. The trimming potentiometer as defined in claim 1 wherein said trimming potentiometer is connected in a Pi-network configuration.

9. The trimming potentiometer as defined in claim 1 wherein said trimming potentiometer is matched frequency-wise to its inductive and capacitive input and output values.

* * * * *